United States Patent [19]

Laine et al.

[11] Patent Number: 5,071,833
[45] Date of Patent: Dec. 10, 1991

[54] METHOD FOR PRODUCING HIGH-TEMPERATURE SUPERCONDUCTING CERAMIC PRODUCTS EMPLOYING TRACTABLE CERAMIC PRECURSORS

[75] Inventors: Richard M. Laine, Seattle; Kay A. Youngdahl, Lynnwood, both of Wash.

[73] Assignee: The Washington Technology Center, Seattle, Wash.

[21] Appl. No.: 180,171

[22] Filed: Apr. 11, 1988

[51] Int. Cl.⁵ .............................................. H01L 39/24
[52] U.S. Cl. ......................................... 505/734; 505/1
[58] Field of Search ...................... 505/1, 734; 501/89, 501/90

[56] References Cited

U.S. PATENT DOCUMENTS 4,880,770 11/1989 Mir et al. .................................. 505/1
4,918,051 4/1990 Mantese et al. .......................... 505/1

OTHER PUBLICATIONS

"Preparation of Glasses and Ceramics from Metal-Organic Compounds" B. E. Yoldas, J. of Mat. Science 12(1977) 1205-1208.

"Rapid Thermal Annealing of High Tc Superconducting Thin Films formed by Metalorganic Deposition" J. V. Mantese et al. App. Phys. Lett. vol. 52 #19–May 9, 1988.

Hawley's Condensed Chemical Dictionary Eleventh Edition ®1987 Van Nostrand Reinhold Co., N. Y.

Primary Examiner—William R. Dixon, Jr.
Assistant Examiner—Alan Wright
Attorney, Agent, or Firm—Christensen, O'Connor, Johnson & Kindness

[57] ABSTRACT

A tractable ceramic precursor and method for producing the same, capable of being formed into useful shapes at low temperatures and thereafter capable of transformation into high-temperature superconducting ceramics is provided. The method consists of preparing one or more organometallic compounds selected from organometallic clusters and organometallic polymers and combining them in the proper stoichiometric ratio to form a tractable ceramic precursor having rheological/viscoelastic properties suitable for forming useful shapes and having metal elements in suitable proportions to form high-temperature superconducting ceramics.

15 Claims, 3 Drawing Sheets

METHOD FOR PRODUCING HIGH-TEMPERATURE SUPERCONDUCTING CERAMIC PRODUCTS EMPLOYING TRACTABLE CERAMIC PRECURSORS

FIELD OF THE INVENTION

This invention relates to a method for producing high-temperature superconducting ceramics. The invention further relates to a process for producing high-temperature superconducting fibers, coatings, and binders from organometallic precursors.

BACKGROUND OF THE INVENTION

The field of high-temperature superconductivity can trace its origins to the discovery by Bednorz and Müller, Z, Phys. B64, 189 (1986) less than two years ago. Since that time, the search for new high-$T_c$ ceramic oxide superconductors has been mostly Edisonian in nature. That is, mix this with that, heat under oxygen to 800°-1100° C., cool slowly, and test for superconductivity. This approach appears to be the method of choice until sufficient knowledge is gained to establish the scientific principles necessary to design and synthesize new single-phase, high-$T_c$ superconductors capable of handling high current densities.

Within the last year, a number of fundamental requirements have been established with regard to the ceramic molecular structure necessary to obtain high-$T_c$ superconductivity. For those oxides exhibiting $T_c>90K$, these requirements include: a layered perovskite, $K_2NiF_4$, orthorhombic oxide structure; a single-phase material of approximate composition, $LBa_2Cu_3O_{\sim 6.5}$, where L is a lanthanide metal; or $Bi_2Sr_{3-z}Ca_zCu_2O_{\sim 8}$, where z ranges from 0.4-0.9, $CuO_2$ layers with polymeric Cu—O bonds. The ceramic structure is often prepared in an oxygen-rich atmosphere to avoid oxygen vacancies. Additionally, it now appears that molecular requirements for all high-temperature superconducting ceramics includes a lanthanide or equivalent-sized trivalent ion, an alkaline earth, copper, and oxygen (Sheng et al., Nature, 332, 55 (1988)).

More recently, Guo et al., Science, 239, 896 (1988), have reported that superconducting ceramics having structures represented by empirical formulae $La_{2-x}Sr_xCuO_4$ and $YBa_2Cu_3O_{7-x}$ have (Cu—O)$_n$ sheets or chains in which the adjacent ($d^9$) Cu(II) sites are antiferromagnetically coupled. Subramanian et al., Science, 239, 1015 (1988) also report the existence of $CuO_2$ layers with Cu—O bonds in the newly discovered $Bi_2Sr_{3-z}Ca_zCu_2O_{\sim 8}$ 120K superconducting material. Whether the new $Tl_2Ba_2Cu_3O_{\sim 8}$ superconducting material reported by Sheng et al. also contains polymeric Cu—O bonds remains to be seen.

Still other properties of high-temperature, superconducting ceramics must be realized before these materials can become truly useful. For example, to use the new superconductors in many applications, these materials must be able to carry large current densities at high fields. A number of authors have stated that porosity has limited their ability to achieve high current densities or to accurately establish the density of states from the slope of $H_{c2}$ at $T_c$. The low current densities presently found in these ceramics may also be due to a combination of phenomena, including single-crystal anisotropy, regional superconductivity degradation at grain boundaries, and pinning variation, all recently received by Geballe et al., Science, 239, 367 (1988).

Finally, an important physical property that is a prerequisite to these new superconducting materials being transformed from materials of academic interest into materials of practical application is the capacity to be fabricated into fibers for use in superconducting magnets or thin films for microelectronic applications. Current ceramic processing methodology relies on high-temperature, energy- and equipment-intensive techniques to form fully dense ceramic shapes. A typical example of a current fabrication technique employs the sol-gel approach coincident with heating and annealing under pressurized $O_2$ (see, for example, Iqbal et al. Nature, 331, 326 (1988)). Sol-gel methodology requires a hydrolysis or alcoholysis step to form a spinnable material. The hydrolysis or alcoholysis step often leads to gels whose viscosity is difficult to control and, thus, unsuitable for use in most fabrication techniques.

Accordingly, a need exists for a process of producing a ceramic precursor that is capable of being fabricated into useful shapes such as fibers and films, that, can be transformed into a high-temperature superconducting ceramic of the desired shape.

SUMMARY OF THE INVENTION

This need is met by providing a process for producing high-temperature superconducting ceramics, the high-temperature superconducting ceramics being represented by empirical Formula I:

$$M_m^1 M_n^2 O_o \qquad (I)$$

where: $M^1$ is at least one metal element different from $M^2$, $M^2$ is Cu, Nb, or Ag, and m, n, and o are independent stoichiometric indices of each element in empirical Formula I, provided than when $M^1$ is more than one metal element, m is the independent stoichiometric index of each metal element $M^1$.

The process comprises the steps of (a) forming a tractable ceramic precursor, the precursor comprising an organometallic substance containing metal elements $M^1$ and $M^2$, the relative proportions of metal elements $M^1$ and $M^2$ in the organometallic substance being present in substantially the same ratio as the stoichiometric index of metal elements $M^1$ and $M^2$ in Formula I; (b) optionally shaping the ceramic precursor, the shaping step consisting of drawing, extruding, or spinning the precursor into fibers or forming thin films, coatings or laminates; (c) curing the ceramic precursor, thereby forming an infusible organometallic matrix; and (d) pyrolyzing the infusible organometallic matrix at a temperature sufficient to form the high-temperature superconducting material.

The method is particularly appropriate for forming unique shapes of high-temperature superconducting material represented by Formula I, where the material is a compound selected from the group consisting of compounds represented by empirical Formulae II, III, IV, and V:

$$LBa_2Cu_3O_{\sim 6.8} \qquad (II),$$

$$Tl_2Ba_2Cu_3O_{\sim 8} \qquad (III),$$

$$Bi_2Sr_{3-z}Ca_zCu_2O_{\sim 8} \qquad (IV).$$

$$La_2SrNb_5O_{10} \qquad (V),$$

where:

L is Y or a lanthanide metal; and z ranges from about 0.4 to about 0.9.

The invention further consists of a tractable ceramic precursor useful for preparing high-temperature superconducting ceramics. The high-temperature superconducting ceramic being represented by empirical Formula I, $$M_m^1 M_n^2 O_o \tag{I}$$

In Formula I, $M^1$ is at least one metal element different from $M^2$; $M^2$ represents Cu, or Nb; and m, n, and o are independent stoichiometric indices for each element in empirical Formula I, provided that when $M^1$ is more than one metal element, m represents an independent stoichiometric index of each metal element $M^1$. The tractable ceramic precursor consists of an organometallic substance and optionally an inert solvent. The organometallic substance comprises a mixture of one or more compounds independently selected from compounds represented by Formulae X and XI:

$$G(O_2CR^1) \tag{X},$$

$$-[R_w^4 G(O_2CR^3)]_h- \tag{XI},$$

where G is one or more monovalent, divalent, or trivalent metal elements $M^1$ and $M^2$; $R^3$ is $C_1$-$C_7$ alkanoate, $C_3$-$C_7$ branched or unbranched alkenoate; $R^4$ is $R^3$, $C_4$-$C_7$ β-diketone, $C_4$-$C_8$ β-ketoester, or $C_4$-$C_7$ alkoxide; w is zero or one when G is divalent, and one or two when G is trivalent; h ranges from 2 to about 200; and $R^1$ is hydrogen, alkyl, alkenyl or alkenyl or alkynyl having 1 to 7 carbons, cycloalkyl or cycloalkenyl having 3 to 7 carbons, cycloalkylalkyl having 4 to 8 carbons, aryl having 5 to 8 carbons and alkylaryl or arylalkyl having 6 to 8 carbons. These radicals may optionally be substituted with one or more substituents selected from the group consisting of halogen, —OH, —OR, —O₂CR, —CO₂H, —CO₂R, —CO₃H, —CO₃R, —CONH₂, —CONR, —CONHR, —NNH₂, —NR₂, —NHR, —SR, —SOR, —SO₂R, —SO₂NR₂, —SO₂NH₂, SO₂NHR, or may contain as linking groups —O—, —O—O—, —NH—, —NR—, —CO—, —CO₂—, —CONH—, —CONR—, —S—, —SO—, —SO₂—, —CO₂NH—, and —SO₂NR—. R above is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 6 to 7 carbons, and alkylaryl having 7 to 8 carbons. The relative proportions of metal elements $M^1$ and $M^2$ in the mixture being present in substantially the same ratio as the stoichiometric index of metal elements $M^1$ and $M^2$ in empirical Formula I.

Optionally, metallic particles containing metal elements $M^1$ and $M^2$ can be added to the mixture so that the organometallic substance contains metal elements $M^1$ and $M^2$ in substantially the same ratio as the stoichiometric index of metal elements $M^1$ and $M^2$ in empirical Formula I.

DETAILED DESCRIPTION OF THE INVENTION

Figure 1:
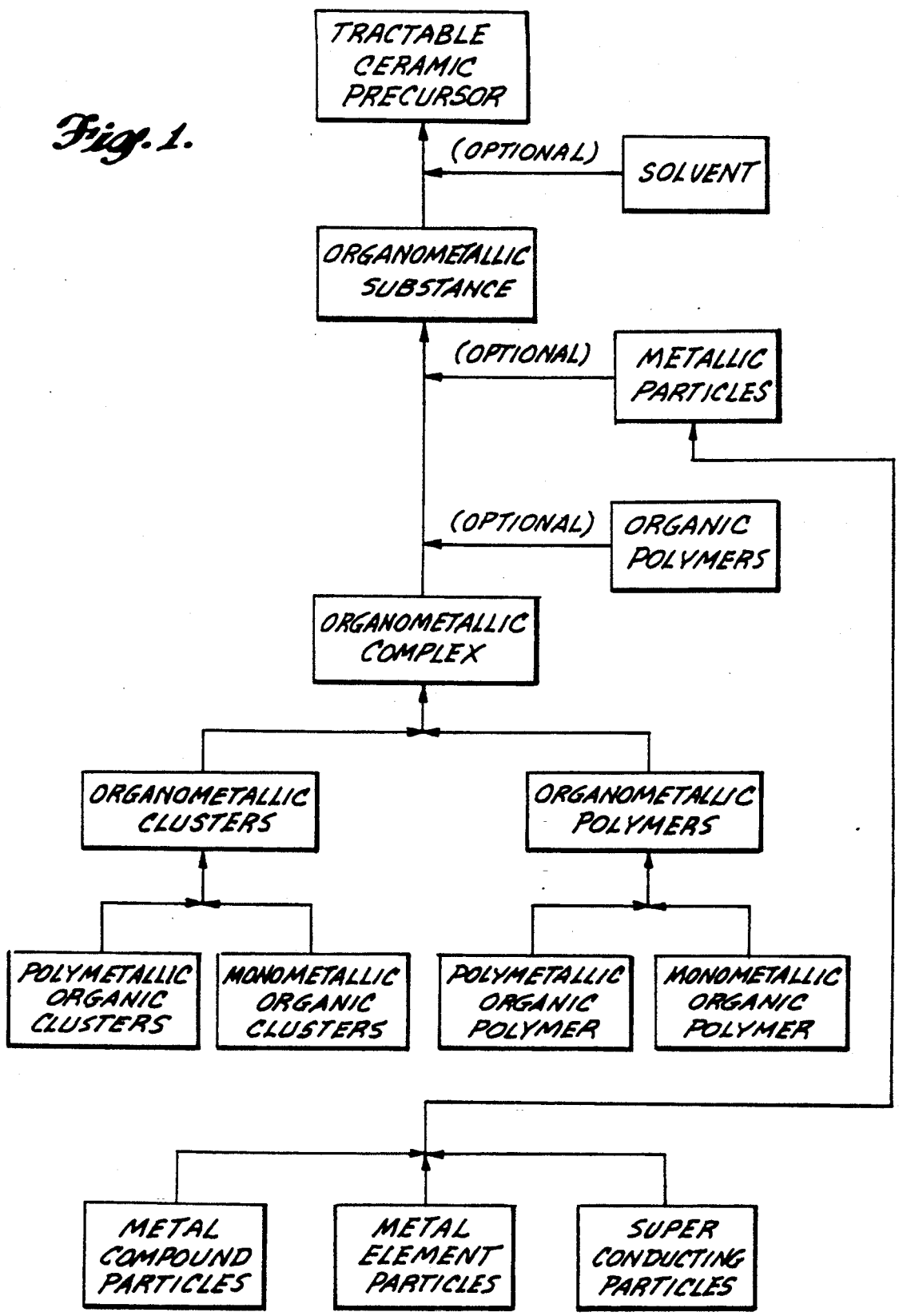
FIG. 1 is a flow chart illustrating the various ways in which the tractable ceramic precursor may be formed.

The invention consists of a method for preparing high-temperature superconducting ceramics; in particular, fibers, wires, coatings, binders, and laminates useful in manufacturing, for example, high-field superconducting magnets and electronic devices. The invention is also useful for producing high-temperature superconducting ceramics for a variety of other applications including but not limited to those described in Geballe et al., Science, 239, 367 (1988), herein incorporated by reference. By "high-temperature superconducting ceramic," as used herein, is meant ceramic material having a superconducting transition temperature ($T_c$) of at least 40K and preferably at least 77K.

The method of this invention is suitable for producing high-temperature superconducting ceramics of the type represented by empirical Formula I from tractable ceramic precursors:

$$M_m^1 M_n^2 O_o \tag{I}.$$

where: $M^1$ is at least one metal element different from $M^2$; $M^2$ is Cu or Nb; and m, n, and o are independent stoichiometric indices for each element in empirical Formula I, provided than when $M^1$ is more than one metal element, m represents an independent stoichiometric index for each metal element $M^1$.

Preferred ceramic materials that can be produced by the method of this invention are those in which $M_m^1$ represents two metal elements $L_j A_k$, where j and k represent the independent stoichiometric indices for metal elements L and A. L above is a multivalent metal, preferably trivalent, having an ionic radius ranging from about 1.015 to about 0.85 Å. This includes the lanthanides and actinides as well as other metals including but not limited to Bi, Y, and Tl. The stoichiometric index j, for metal element L, preferably is one or two. A comprises at least one alkaline earth metal, for which stoichiometric index k preferably ranges from about 2 to about 3. The stoichiometric index n ranges from 2 to 5, i.e., preferably 2 or 3 for Cu and 5 for Nb, while o ranges from about 6 to about 10. None of the stoichiometric indices above are necessarily integers.

Examples of most preferred ceramic materials that can be prepared by the method of this invention are those represented by empirical Formulae II, III, IV, and V.

$$LBa_2Cu_3O_{\sim 6.8} \tag{II},$$

$$Tl_2Ba_2Cu_3O_{\sim 8} \tag{III},$$

$$Bi_2Sr_{3-z}Ca_zCu_2O_{\sim 8} \tag{IV},$$

$$La_2SrNb_5O_{10} \tag{V}.$$

where L is Y or a lanthanide and z ranges from about 0.4 to about 0.9.

Generally, the method of this invention consists of: (a) forming a tractable ceramic precursor, in which the precursor comprises an organometallic substance containing metal elements $M^1$ and $M^2$, the relative amounts of metal elements $M^1$ and $M^2$ in the tractable ceramic precursor being present in substantially the same ratio as the stoichiometric index of metal elements $M^1$ and M² in empirical Formula I; (b) curing the ceramic precursor, thereby forming an infusible organometallic matrix; and (c) pyrolyzing the infusible organometallic matrix at a temperature sufficient to form a high-temperature superconducting ceramic.

The organometallic substance of this invention is made from organometallic compounds such as organometallic clusters and organometallic polymers. The advantage of producing superconducting ceramics of the type represented by Formulae I-V from organometallic compounds is that these compounds can be formed into polymers which comprise a tractable ceramic precursor useful for fabricating articles of manufacture such as fibers, wires, coatings, and binders. By controlling the elemental stoichiometry in the tractable ceramic precursor, the correct final stoichiometry in the ceramic material represented by Formulae I-V can be achieved.

FORMING THE CERAMIC PRECURSOR

The various ways of forming a tractable ceramic precursor are best understood by referring to FIG. 1. Generally, the tractable ceramic precursor comprises a substantially anhydrous organometallic substance that contains metal elements $M^1$ and $M^2$ in the same relative proportions as the stoichiometric index of metal elements $M^1$ and $M^2$ in empirical Formula I. The organometallic substance may be tractable without further processing; however, it may require melting, that is, adding heat, an inert nonaqueous solvent, or both before the proper rheological/viscoelastic properties are achieved.

The organometallic substance comprises an organometallic complex containing at least one metal $M^1$ or $M^2$ and optionally metallic particles and organic polymers. The organic polymers may be added to improve the rheology of the organometallic substance so that it is suitable for spinning, coating, or binding. Exemplary organic polymers suitable for use include but are not limited to polyethylene oxide and polymethyl methacrylate. The amount added will depend on both the rheology of the organometallic complex and the particular application for which the organometallic substance is intended. It is preferred that minimal amounts of organic polymers are added so that the ceramic yield, discussed below, will remain high.

Metallic particles, such as preformed superconducting oxide particles, or metallic particles, such as metal elements and metal compounds, may be added to improve the superconducting properties of the final ceramic material. In the latter case, metal elements or metal compounds containing $M^1$ and $M^2$ may be added when one or more metal elements $M^1$ or $M^2$ in empirical Formula I are missing from the organometallic complex or are present in proportions less than equal to the stoichiometric index of metal elements $M^1$ and $M^2$ in empirical Formula I. The amount of metal elements or metal compounds containing $M^1$ and $M^2$ added to the organometallic complex is that amount necessary to produce an organometallic substance with relative proportions of metal elements $M^1$ and $M^2$ substantially equal to the stoichiometric index of metal elements $M^1$ and $M^2$ in empirical Formula I. Any metal element $M^1$ or $M^2$ is suitable for addition to the organometallic complex. Suitable metal compounds containing metal elements $M^1$ and $M^2$ include but are not limited to metal oxides, metal hydrides, and metal carbonates.

The organometallic complex comprises one or more organometallic clusters, organometallic polymers, or combinations thereof.

The organometallic clusters comprise monometallic organic clusters, polymetallic organic clusters, and combinations thereof represented by Formula VI:

$$G(R^0) \hspace{2cm} (VI),$$

where G is one or more metal elements selected from $M^1$ and $M^2$, and $R^0$ is independently one or more lower organic ligands. Suitable lower organic ligands $R^0$ are selected from the group alkyl, alkenyl or alkynyl having 1 to 8 carbons, cycloalkyl or cycloalkenyl having 5 to 8 carbons, cycloalkylalkyl having 4 to 8 carbons, aryl having 5 to 8 carbons, alkylaryl or arylalkyl having 6 to 8 carbons, and carboxy or peroxycarboxy having 1 to 8 carbons. These radicals may optionally be substituted with one or more substituents selected from the group consisting of halogen, —OH, —OR, —O₂CR, —CO₂H, —CO₂R, —CO₃H, —CO₃R, —CONH₂, —CONR, —CONHR, —NNH₂, —NR₂, —NHR, —SR, —SOR, —SO₂R, —SO₂NR₂, —SO₂NH₂, and SO₂NHR. These radicals may also contain as linking groups —O—, —O—O—, —NH—, —NR—, —CO—, —CO₂—, —CONH—, —CONR—, —S—, —SO—, —SO₂—, —CO₂NH—, and —SO₂NR—. R above is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 5 to 7 carbons, and alkylaryl having 6 to 8 carbons.

Preferred organic ligands $R^0$ are represented by Formula VII:

$$O_2CR^1 \hspace{2cm} (VII),$$

where $R^1$ is hydrogen, alkyl, alkenyl or alkynyl having 1 to 7 carbons, cycloalkyl or cycloalkenyl having 3 to 7 carbons, cycloalkylalkyl having 4 to 7 carbons, aryl having 5 to 7 carbons and alkylaryl or arylalkyl having 6 to 8 carbons. These radicals may optionally be substituted with one or more substituents selected from the group consisting of halogen, —OH, —OR, —O₂CR, —CO₂H, —CO₂R, —CO₃H, —CO₃R, —CONH₂, —CONR, —CONHR, —NNH₂, —NR₂, —NHR, —SR, —SOR, —SO₂R, —SO₂NR₂, —SO₂NH₂, and SO₂NHR. These radicals may also contain as linking groups —O—, —O—O—, —NH—, —NR—, —CO—, —CO₂—, —CONH—, —CONR—, —S—, —SO—, —SO₂—, —CO₂NH—, and —SO₂NR—. R above is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 5 to 7 carbons, and alkylaryl having 6 to 8 carbons.

Organometallic polymers having a repeat unit moiety $G-R^2$ comprise monometallic organic polymers, polymetallic organic polymers, and combinations thereof, represented by Formula VIII.

$$-[G-R^2]_g- \hspace{2cm} (VIII),$$

where G is one or more metal elements selected from $M^1$ and $M^2$, and $R^2$ is at least one lower organic ligand for each metal element $M^1$ and $M^2$. Preferred lower organic ligands are selected from alkyl, alkenyl or alkynyl having 1 to 8 carbons, cycloalkyl or cycloalkenyl having 3 to 8 carbons, cycloalkylalkyl having 4 to 8 carbons, aryl having 5 to 8 carbons, alkylaryl or arylalkyl having 6 to 8 carbons, and carboxy or peroxycarboxy having 1 to 8 carbons. These radicals may optionally be substituted with one or more substituents selected from the group consisting of halogen, —OH, —OR, —O$_2$CR, —CO$_2$H, —CO$_2$R, —CO$_3$H, —CO$_3$R, —CONH$_2$, —CONR, —CONHR, —NNH$_2$, —NR$_2$, —NHR, —SR, —SOR, —SO$_2$R, —SO$_2$NR$_2$, —SO$_2$NH$_2$, and SO$_2$NHR. These radicals may also contain as linking groups —O—, —O—O—, —NH—, —NR—, —CO—, —CO$_2$—, —CONH—, —CONR—, —S—, —SO—, —SO$_2$—, —CO$_2$NH—, and —SO$_2$NR—. R above is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 6 to 7 carbons, and alkylaryl having 7 to 8 carbons. "g" ranges from about 2 to about 200.

Most preferred lower organic ligands R$^2$ are represented by Formula IX:

where

R$^3$ is C$_1$-C$_7$ alkanoate, or C$_1$-C$_7$ alkenoate;
R$^4$ is R$^3$ or C$_4$-C$_7$ β-diketone, C$_1$-C$_8$ β-ketoester; and
w is zero or one when G is divalent, and one or two when G is trivalent.

The way in which the various lower organic ligands R$^0$-R$^4$, represented in Formulae VI-IX, are selected for use in forming a useful tractable ceramic precursor will be better appreciated after referring to the various criteria discussed below. This discussion is meant to assist one of ordinary skill to optimize selection of the appropriate lower organic ligands for use in the ceramic precursor and is not to be construed as limiting in any way the remainder of the disclosure.

MACROMOLECULAR CRITERIA OF THE CERAMIC PRECURSOR

To be useful in accordance with the present invention, the ceramic precursor must be tractable. By "tractable," as used herein, is meant having the appropriate rheological/viscoelastic properties to permit shaping of the ceramic precursor. Examples of shaping include, but are not limited to, spinning or drawing fibers, coating a substrate, or binding metal particles together. The appropriate rheological/viscoelastic properties are known to those skilled in the art and depend on the particular application (i.e., spinning, drawing, coating, or binding) for which the precursor is intended. The rheological properties necessary for spinning fibers can, for example, be found in Han, C. D., *Rheology in Polymer Processing*, Academic Press, N.Y. (1976) or Ziabicki, A., *Fundamentals of Fiber Formation*, John Wiley, N.Y. (1976). Rheological properties necessary for coating a substrate can be found, for example, in Levich, V. G., *Physicochemical Hydrodynamics*, Prentice-Hall, Englewood Cliffs, N.J. (1962).

Minimally, to be "tractable" requires that the ceramic precursor be either liquid, meltable, appreciably soluble in organic solvents, or malleable. Additionally, depending on the application, other rheological/viscoelastic properties are necessary. For example, to produce fibers in the range of from 0.1 to 300 μm in diameter it is preferred that the ceramic precursor exhibit non-Newtonian viscosity. The ceramic precursor should have high enough viscosity and sufficiently low surface tension to eliminate capillary breakup of the "polymer thread" during extrusion (see FIG. 3). However, the viscosity should not be so high that cohesive failure or a "snap-off" event occurs. As previously described, the ceramic precursor may contain certain high molecular weight organic polymers to assist in producing the proper rheology for spinning. Exemplary high molecular weight organic polymers that may be added to produce a ceramic precursor of the proper rheology include polyethylene oxide and polymethyl methacrylate.

For large fibers or wires, in addition to viscous liquids, meltable ceramic precursors may be suitably employed in an extrusion process, provided that the ligands impart sufficient thermal stability to permit melting to occur without depolymerization (see below).

For coating a substrate with, for example, a thin film, it is preferred that the ceramic precursor be a liquid of controlled viscosity, capable of wetting the particular substrate to which it is applied.

To be suitable for use as a binder, for example, to bind together metallic particles such as metal elements, metal compounds, or preformed superconducting oxides, the ceramic precursor should be either a liquid, a solution, or meltable and possess sufficient adhesive and cohesive properties to bind these particles together. The advantage of adding preformed superconducting oxides to the ceramic precursor is that it may improve densification and decrease shrinkage of the final superconducting ceramic product.

In general, the rheological/viscoelastic properties arise from the degree of polymerization and the inter-/intra polymer interactions within the ceramic precursor. This in turn depends on the repeat unit moiety structure, particularly the structure of ligands R$^0$-R$^4$ in Formulae VI-IX, as well as the inert solvent. Therefore, selecting the appropriate ligand with which to build an organometallic complex is important in determining the rheology of the ceramic precursor. The other important component of the ceramic precursor affecting the rheological/viscoelastic properties is the optional inert solvent. The amount and type of inert solvent added to the ceramic precursor can be adjusted to produce the desired rheological property. Exemplary inert solvents that can be added to produce the correct rheology include, but are not limited to, tetrahydrofuran (THF), N-methylpyrrolidone (NMP), CHCl$_3$, EtOH, xylene, and glycerol.

There are additional properties that make a tractable ceramic precursor useful for producing the high-temperature superconducting ceramics of this invention. Thus, a good tractable ceramic precursor should be composed of one or more organometallic polymers or organometallic clusters in which the repeat unit moiety has sufficient molecular weight such that the precursor will decompose to ceramic when pyrolyzed, rather than volatilize. Additionally, it should also give a high ceramic yield (on a weight percent basis). This can only occur if the molecular weight of the repeat unit moiety (or some approximate multiple) shown in Formula VIII is not greatly different from the formula weight of the ceramic product given in empirical Formula I. Otherwise, the volume change during pyrolysis will be excessive, and the opportunity to obtain a dense, defect-free ceramic product will be diminished. Furthermore, the greater the difference between the molecular weight and the formula weight, the more chance there is to incorporate impurities since more unwanted ligands must be eliminated during pyrolysis.

Additionally, unlike organic polymers, many of which are known to depolymerize when heated, organometallic polymers must not depolymerize during pyrolysis, otherwise ceramic yields will be minimal.

MOLECULAR CRITERIA OF THE CERAMIC PRECURSOR

Stoichiometry

Because transformation of the ceramic precursor to product must lead to a superconducting ceramic with a defined composition and phase, it is preferred that the elemental make up of the organometallic substance closely approximate that of the final product. If pyrolysis is conducted in a reactive atmosphere containing one of the elements desired in the final product, for example oxygen, then strict control of the stoichiometry for that element is not necessary. However, the elements whose stoichiometry should be most carefully controlled in the organometallic substance are the metal elements $M^1$ and $M^2$. In general, it is preferred that the relative proportions of metal elements $M^1$ and $M^2$ in the organometallic complex be present in substantially the same ratio as the stoichiometric index of elements $M^1$ and $M^2$ in the superconducting ceramic product represented by empirical Formula I.

By way of illustration, if the superconducting ceramic to be produced is a Y—Ba—Cu compound represented by empirical Formula II(a), $$YBa_2Cu_3O_{-6.8} \qquad II(a),$$

then it is preferred that the amounts of Y, Ba, and Cu in the ceramic precursor be present in the atomic ratio 1:2:3 respectively. Therefore, if the ceramic precursor is composed of three monometallic organic polymers where the repeat unit moieties in Formula VIII are represented by
 (a) Y—R',
 (b) Ba—R', and
 (c) Cu—R', where R' represents a lower organic ligand, then it is preferred that the molar ratio of the repeat unit moieties a:b:c in the organometallic polymer be about 1:2:3.

If, on the other hand, the ceramic precursor is composed of a single trimetallic organic polymer containing all three metals Y, Ba and Cu, then it is preferred that the atomic ratio of Y:Ba:Cu in the trimetallic organic polymer be about 1:2:3. An exemplary trimetallic organic polymer containing Y:Ba:Cu in a 1:2:3 molar ratio with Cu as Cu(I) is:

—{[(R"$CO_2$)Y($O_2$C($CH_2$)$_2CO_2$)$_2$]$Cu_3Ba_2$(R$CO_2$)$_2$-[($O_2$C($CH_2$)$_2CO_2$)$_2$]}$_n$— wherein R" is a lower alkyl group, the synthesis of which is described below.

It will be appreciated that a plurality of polymers either mono, di-, or trimetallic can be combined, as illustrated above, to produce a ceramic precursor with relative proportions of metal elements Y, Ba, and Cu in a ratio of about 1:2:3 respectively. Similarly, by combining mono-, di-, tri-, and higher metallic polymers, as illustrated above, in the proper ratio, a ceramic precursor can be produced in which the relative proportions of metal elements $M^1$ and $M^2$ are present in substantially the same ratio as the stoichiometric index of metal elements $M^1$ and $M^2$ in empirical Formula I.

Ligands

The macromolecular criteria described above limit the types of ligands that can be used in the repeat unit moieties which make up the organometallic polymers. First, it is preferred that the ligands impart tractability to the organometallic polymers (i.e., liquid, soluble, meltable, or malleable). It is also preferred that the ligands impart thermal stability and in many applications, it is desirable that the ligands provide low-temperature resistance to oxidation and hydration.

The need for high ceramic yield limits the size and number of extraneous ligands that can be used because these ligands must be lost during pyrolysis. The primary problems associated with the transformation process are derived from the volume and density changes that occur during pyrolysis. The typical ceramic is substantially denser than its precursor. Consequently, there will be a large change in volume as the ceramic product evolves. This volume change becomes more significant if some part of the elements desired in the ceramic product volatilize instead of forming ceramic product. This lowers the overall ceramic yield, magnifies the volume changes necessary to obtain fully dense material, and may produce "off-stoichiometry" ceramic products. By way of illustration, ligands which permit a high ceramic yield would be ones that are small, that is containing few elements other than those desired in the ceramic product. For example, a formate ligand would lead to a higher ceramic yield than, for example, an acetate or propanoate ligand.

It may be necessary to have a certain number of extraneous ligands in the organometallic polymers. These ligands may be necessary to provide stability, tractability, or curability (i.e., ability to cross-link) to the organometallic substance. Examples of extraneous ligands include, by way of illustration, polyfunctional molecules like dicarboxylic acids, alkenoic acids, ketoacids, amino acids, hydroxy acids and the like. These extraneous ligands must also be lost during pyrolysis and, hence, it is preferred to keep these ligands to a minimum in the organometallic substance while still retaining the necessary macromolecular properties. For the foregoing reasons, it is less desirable for the ligands to contain phenyl or long-chain alkyl groups.

The need to approximate the product stoichiometry also influences the types of ligands that can be effectively employed in the organometallic polymers. Since oxygen is a necessary element in the high-temperature superconducting ceramic, it is preferred that the organic ligands contain oxygen. Suitable oxygen containing ligands include but are not limited to ethers, acetals, hemiacetals, alcohols, aldehydes, esters, ketones, carboxylates, peroxycarboxylates, and combinations thereof. Preferred ligands are carboxylates, β-diketones, and β-ketoesters. The advantage of having oxygen in the ligand is that the presence of direct bonds between the metal and oxygen in the repeat unit moiety provides the highest probability of retaining these bonds in the final ceramic product independent of the pyrolysis conditions. This enhances the opportunity to form the target high-temperature superconducting ceramic.

Accordingly, most preferred ligands are selected from the group consisting of $C_5$–$C_7$ β-diketones, $C_5$–$C_8$ β-ketoesters, $C_1$–$C_8$ branched or linear alkanoic acids, $C_3$-$C_8$ branched or linear alkenoic acids, $C_1$-$C_7$ branched or linear alkoxides, $C_2$-$C_6$ saturated or unsaturated branched or linear dicarboxylic acids, $C_2$-$C_6$ oxygen substituted dicarboxylic acids and $C_4$-$C_6$ tricarboxylic acids. Very most preferred ligands are selected from the group consisting of 2,4-pentanedione, ethylacetoacetate, 2-ethylhexanoic, isobutylacetoacetate, perfluoroacetic, succinic, isobutyric, glutaric, fumaric, maleic, citric, isocitric, and itaconic acids.

Synthesis of the Tractable Ceramic Precursor

The method of forming a ceramic precursor varies according to the particular metal elements $M^1$ and $M^2$ targeted in the high-temperature superconducting ceramic, the particular rheological/viscoelastic properties desired, as well as other criteria previously described.

By way of illustration, a tractable ceramic precursor suitable for producing superconducting ceramic fibers having a composition $YBa_2Cu_3O_{\sim 6.8}$ can be formed according to the various approaches described below, as well as those previously described. By analogous procedures, tractable ceramic precursors suitable for producing superconducting ceramic materials having the general composition $M_m^1 M_n^2 O_o$ as defined in Formula I, can be similarly formed.

Polymetallic Organic Polymer Approach

In this approach, it is preferred that a dimetallic organic cluster containing Cu and Ba first be formed. This can be accomplished by synthesizing the dimetallic organic cluster $Cu_3Ba(RCO_2)_5$ by procedures similar to those described by Drew et al., J.C.S. Chem. Comm. 124-125 (1973). It is preferred that two ligands represented as $RCO_2$ above be the dicarboxylic acids fumarate or succinate, to provide a binding site for an additional Ba. The intramolecular bridged species containing monomeric units $Cu_3Ba_2(RCO_2)_5(O_2CCH=CHCO_2)_2$ can then for formed by reaction with barium compounds such as $Ba(OAc)_2$, $BaH_2$, or $BaCO_3$, according to Equation (1).

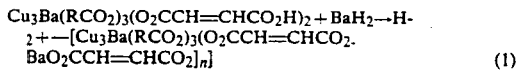

$$Cu_3Ba(RCO_2)_3(O_2CCH=CHCO_2H)_2 + BaH_2 \rightarrow H_2 + -[Cu_3Ba(RCO_2)_3(O_2CCH=CHCO_2 \cdot BaO_2CCH=CHCO_2]_n] \quad (1)$$

Incorporation of yttrium into the product of Equation (1) is then carried out by another exchange reaction with $(RCO_2)_2Y(O_2CCH=CHCO_2H)$ according to Equation (2)

An alternative approach is to react a low-valence yttrium organometallic cluster with the carboxylate cluster. Low-valence organometallic clusters of Y are extremely oxygenophilic. That is, at every opportunity, they will bind to available oxygen even by cleaving C—O single bonds. In fact, Evans et al., J. Am. Chem. Soc. 108-6095 (1986), have shown that $(C_5H_5)_2YCl(THF)$ will react with $KOCH_3 \cdot CH_3OH$ to form the pentametallic oxide, alkoxide cluster; $(C_5H_5)_5Y_5(\mu-OCH_3)_4(\mu_3-OCH_3)_4(\mu_5-O)$. Accordingly, the monometallic organic cluster $[(C_5H_5)_2YH(THF)]_2$ can be used to incorporate Y into the polymetallic organic clusters of the type described above either through reaction with the carboxylate ligands in the cluster or via reaction with the double bonds in the fumarate ligand.

Compounds of the type shown in Equation (2) produced according to the polymetallic organic polymer approach and preferably dissolved in an inert solvent comprise one example of the tractable ceramic precursor of the present invention suitable for transformation into the high-temperature superconducting ceramic fibers.

Mixed Monometallic Organic Polymer Approach

An alternate method of forming a tractable ceramic precursor of metals Y, Ba, and Cu is to prepare monometallic organic polymers of each metal and physically mix these polymers in the approximate proportions. This approach is relatively facile by comparison with the polymetallic organic polymer approach. Its potential drawbacks are that many organic ligands may be required by comparison with the polymetallic organic polymer approach.

Nevertheless, suitable tractable ceramic precursors can be formed as described below. Carboxylato oligomers and polymers of copper are well known. Oligomeric or polymeric species of metals Y and Ba can be synthesized using bifunctional organic acids such as fumaric or succinic acid. Reactions (3)-(8) illustrate the types of reactions, based on well-known chemistry, suitable to prepare useful monometallic organic polymers:

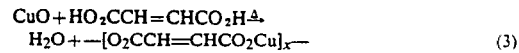
(3)

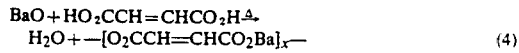
(4)

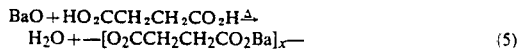
(5)

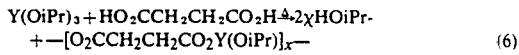
(6)

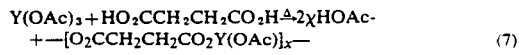
(7)

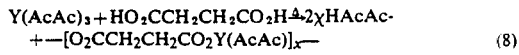
(8)

where OiPr is isopropyl, OAc is acetate, and AcAc is 2,4-pentanedione. Analogous reactions can be carried out with the corresponding metal hydrides and carbonates, or displacement reactions can be conducted with other metal carboxylates. For those reactions that produce water (i.e., (3), (4) and (5)), it is preferred that the reaction be carried out in the presence of an anhydride. Furthermore, choice of the particular organic solvent will often facilitate producing tractable monometallic organic polymers of the products of Equations (3)-(8).

In some situations, no heating is required to produce monometallic polymers. For example, the Cu(I) trifluoroacetate complex, Cu(TFA), is polymeric, yet is soluble in a number of organic solvents.

In other situations, for example with the hexacoordinate lanthanide metals, extensive cross-linking may occur in an anhydrous environment where the "unfulfilled" lanthanide or Y seeks to satisfy its coordination sphere by forming strong interactions with carboxylate ligands coordinated to other Y, Ba or Cu ions. This cross-linking may create an intractable polymer. Cross-linking of this type may be controlled by adding a cross-linking inhibitor such as water or another volatile organic ligand in sufficient amount to inhibit the formation of an intractable highly cross-linked polymer yet retain the desired limited polymerization necessary to form fibers. This form of cross-linking may become the mechanism for curing the spun or cooled ceramic precursor in order to make it infusible as discussed below.

Once the monometallic polymers are prepared, uniform mixtures having the appropriate proportions of these polymers are prepared in the presence of an inert solvent. It is preferred that the proportions of the monometallic polymers containing Y, Ba and Cu be mixed in the stoichiometric ratio of 1:2:3 respectively. By mixing these monometallic polymers in an inert solvent, a tractable ceramic precursor suitable for producing high-temperature superconducting ceramic materials according to the monomolecular polymer approach is formed.

Mixed Monometallic Organic Cluster Approach

Another alternative approach for forming a tractable ceramic precursor in accordance with the present invention consists of preparing monometallic organic clusters in an organic solvent and mixing the monometallic organic clusters in the appropriate proportions to produce a tractable ceramic precursor containing metal elements $M^1$ and $M^2$ in substantially the same ratio as the stoichiometric index of metals $M^1$ and $M^2$ in empirical Formula I.

By "monometallic organic cluster" as used herein is meant one or more metal elements $M^1$ and $M^2$ in combination with one or more lower organic ligands, provided that there are not more than ten of each of the metal elements and lower organic ligands in the cluster. Preferred lower organic ligands in the monometallic organic cluster comprise oxygen containing organic ligands. Most preferred lower organic ligands are carboxylate, peroxycarboxylate, and carbonyl containing ligands. Exemplary preferred lower organic ligands are represented by Formula VII, $$O_2CR^1 \qquad (VII),$$

where $R^1$ is hydrogen, $C_1$-$C_8$ branched or straight-chain alkyl, $C_1$-$C_8$ branched or straight-chain alkenyl, and aryl. Still other preferred lower organic ligands comprise β-diketones such as 2,4-pentanedione and β-ketoesters such as ethylacetoacetate. The most preferred ligands for spinning or coating (discussed in the following section) are 2-ethylhexanoate and isobutyrate.

Accordingly, a monometallic organic cluster of the present invention may be represented by Formula X, $$G(O_2CR^1) \qquad (X),$$

where G is $M^1$ or $M^2$ and $R^1$ is the same as described for Formula VII.

By way of illustration, exemplary monometallic organic clusters for producing Y—Ba—Cu high-temperature superconducting ceramics include but are not limited to: $Cu_4(O_2CPh)_4$, $Cu(O_2CCH_3)$, $Cu(TFA)$, $Cu(O_2CH)_2$, $Cu(O_2CCHMe_2)_2$, $Y(O_2CCHEt(CH_2)_3CH_3)_3$, $Y(O_2CCHMe_2)_3$, $Y(AcAc)_3$, $Ba(O_2CCH_2CH_3)_2$, $Ba$-$(O_2CCHMe_2)_2$, $Ba(TFA)_2$, $Ba(O_2CCHEt(CH_2)_3CH_3)_2$, $Ba(O_2CCF_2CF_3)$, $Ba(O_2CCF_2CF_2CF_3)_2$ and the like, where $O_2CPh$ is benzoate, TFA is trifluoroacetate, Me is methyl, and Et is ethyl.

Preparation of a monometallic cluster according to the present invention is quite general, and comprises reacting the appropriate carboxylic acid or β-diketone with the appropriate metal, metal oxide, metal hydride, metal carboxylate or metal carbonate. The major problem faced in these preparations is the removal of water, both extraneous water and water produced in the synthesis of the monometallic complex. An example of the latter is illustrated in Equation 9. For the reaction of a metal oxide with a carboxylic acid $$MO_y + xRCOOH \rightarrow M(O_2CR)_x + x/2 H_2O \qquad (9)$$

This water may cause the formation of an oxygen bridged species according to Equation (10), which may have an adverse effect on the formation of a useful ceramic precursor.

$$M(O_2CR)_x + H_2O \rightarrow RCO_2M\text{—}O\text{—}MO_2CR + 2\text{-}RCO_2H \qquad (10)$$

Therefore anhydrous monometallic organic clusters such as metal carboxylates are preferably prepared by addition of a water absorbing compound such as anhydride to the reaction mixture to absorb either extraneous or reaction generated water.

Once the appropriate monometallic organic clusters have been prepared, they are admixed, either in solution or in a melt, in the appropriate proportions to form an organometallic complex. As previously described, metallic particles can be added to the organometallic complex to produce an organometallic substance containing metal elements $M^1$ and $M^2$ i proportions substantially equal to the stoichiometric index of metals $M^1$ and $M^2$ in empirical Formula I. It is preferred, however, that the monometallic organic clusters contain all necessary elements $M^1$ and $M^2$ and that they be combines such that the relative amounts of metal elements $M^1$ and $M^2$ in the organometallic complex be substantially the same as the stoichiometric index of the metal elements in empirical Formula I.

The Combination Approach

According to this approach, polymetallic organic polymers, monometallic organic polymers, polymetallic organic clusters, and monometallic organic clusters, prepared as described above, are combined in the appropriate proportions to form a tractable ceramic precursor suitable for transformation into a high-temperature superconducting ceramic. The following combinations are illustrative of this approach:

$$\text{—}[Cu_3Ba(RCO_2)_5(O_2CCH\text{=}CHCO_2\text{-}BaO_2CCH\text{=}CHCO_2]_n\text{—} + Y(O_2CCHMe_2)\text{-}2[O_2CCH(CH_2)_nCO_2H] \qquad (11)$$

$$3\text{-}[O_2CCH\text{=}CHCO_2Cu]_n\text{—} + 2Ba(O_2C\text{-}CHEt(CH_2)_3CH_3)_2 + Y(AcAc)_3 \qquad (12)$$

$$3Cu(TFA) + Ba(O_2CCHMe_2)_2 + Ba(O_2C\text{-}CHEt(CH_2)_3CH_3)_2 + Y(TFA)_3 \qquad (13)$$

Admixing these compounds in the proportions given in Equations 11-13 produces tractable ceramic precursors with different rheological/viscoelastic properties suitable for producing high-temperature superconducting fibers, coatings and binders.

SHAPING THE CERAMIC PRECURSOR

In the most preferred embodiment of the present invention, the tractable ceramic precursor is shaped into a useful form before it is transformed into the final high-temperature superconducting ceramic. In one embodiment, the tractable ceramic precursor is admixed with metal particles, such as preformed superconducting oxides, prior to transformation. In this embodiment, the ceramic precursor acts as a binder. In another embodiment, the tractable ceramic precursor is coated on a substrate before it is cured and pyrolyzed, and, in still another embodiment, the tractable ceramic precursor is drawn or spun into fibers before transforming into a high-temperature superconducting ceramic.

As previously described, each application requires that the tractable ceramic precursor possess certain rheological properties, while still maintaining a high ceramic yield. By way of illustration, a preferred spinnable ceramic precursor for making a $YBa_2Cu_3O_{\sim 6.8}$ superconducting ceramic according to the mixed monometallic organic cluster approach is composed of the following monometallic organic clusters in the relative molar ratios indicated in equation (14):

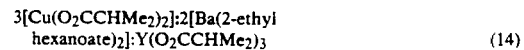

The 2-ethylhexanoate ligand of barium bis(2-ethylhexanoate) imparts useful spinning properties to the mixture of carboxylates. However, 2-ethylhexanoate has an eight-carbon chain. Therefore, a more preferred spinnable ceramic precursor comprises one in which a portion of the 2-ethylhexanoate ligands have been replaced with 2-isobutyrate.

Another method of reducing the carbon content and increasing the ceramic yield of the ceramic precursor consists of replacing Cu(II) monometallic organic clusters with Cu(I) monometallic organic clusters. Accordingly, a still more preferred spinnable ceramic precursor for producing Y—Ba—Cu superconducting ceramics is one in which at least a portion of the copper bis(isobutyrate) in equation (12) is replaced with a Cu(I) monometallic organic cluster. Suitable ligands for the Cu(I) include but are not limited to: $—O_2CCHMe_2$, $—O_2CCF_3$ and $—O_3SCF_3$.

Preferred spinnable ceramic precursors composed of stoichiometric mixtures of monometallic organic clusters are listed below under the appropriate high-temperature superconducting ceramic $\underline{YBa_2Cu_3O_{\sim 6.8}}$

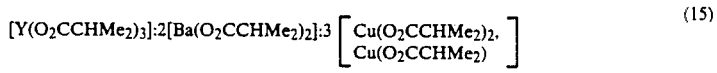

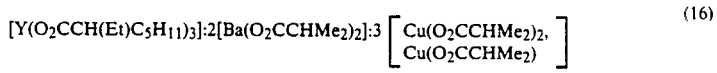

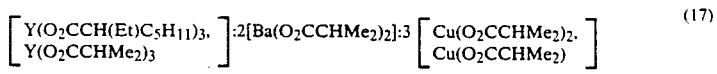

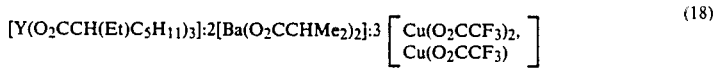

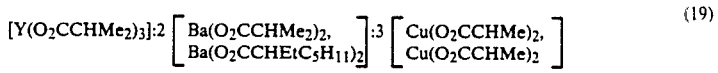

$\underline{Bi_2Sr_{3-x}Ca_xCu_2O_{\sim 8}}$

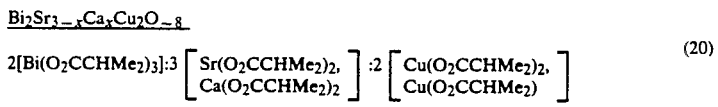

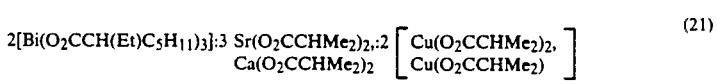

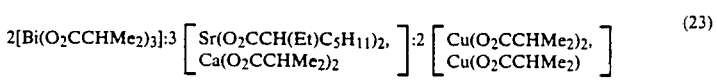

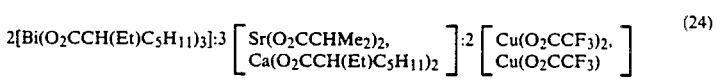

$\underline{La_2SrNb_5O_{10}}$

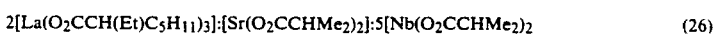

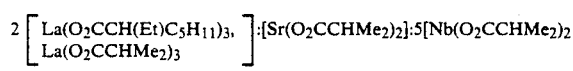  (27)

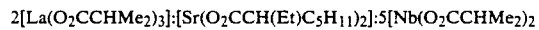  (28)

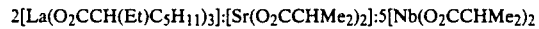  (29)

It is preferred that each organic cluster first be dissolved in an inert solvent. Preferred inert solvents include THF, N-methylpyrrolidone (NMP), CHCl$_3$, EtOH, xylene, and glycerol. The most preferred solvent is THF. Once dissolved, the monometallic organic clusters are admixed in the proportions indicated, followed by removal of a portion of the solvent to produce a spinnable ceramic precursor displaying non-Newtonian viscoelastic behavior.

Spinning

Figure 3:
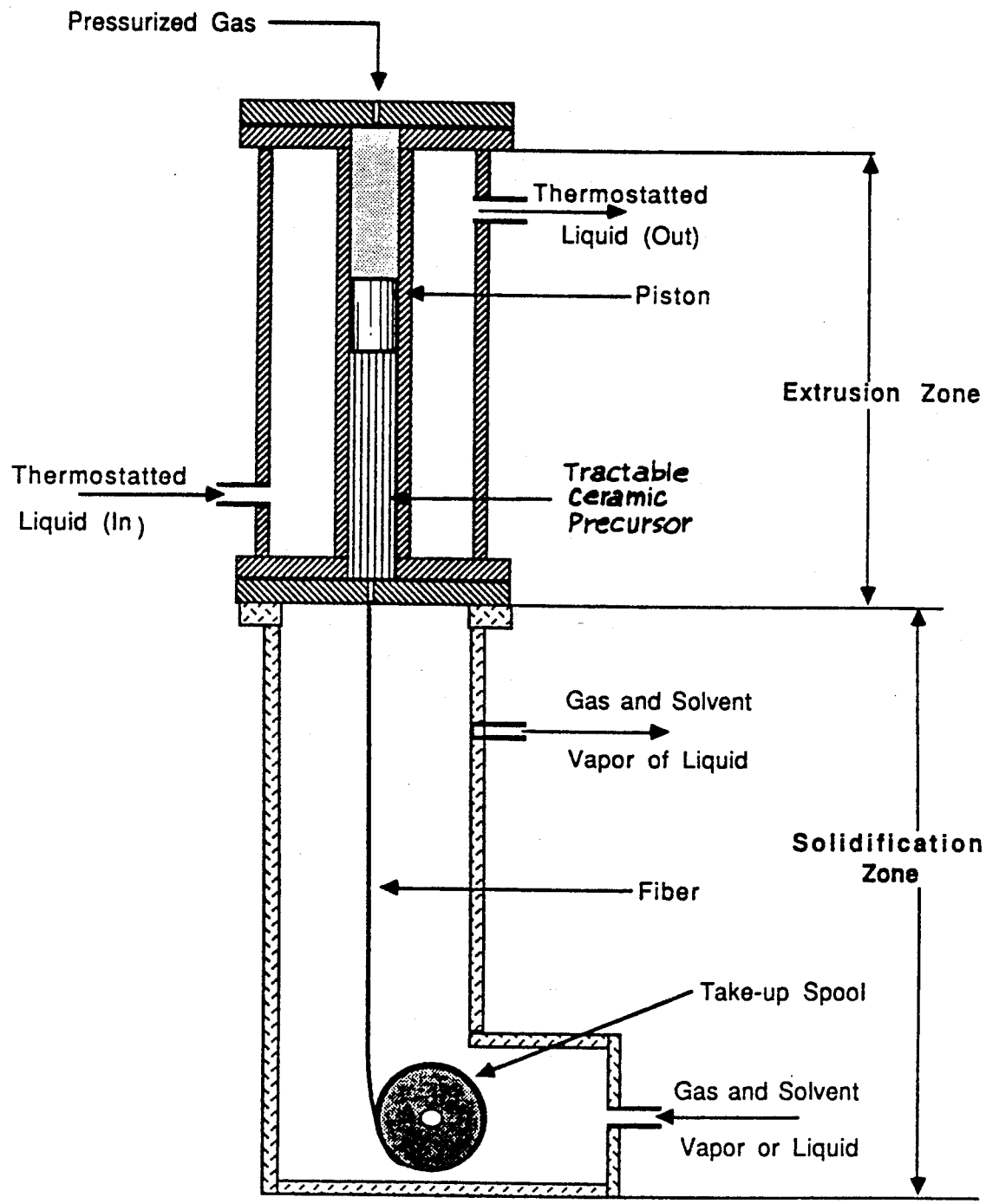
FIG. 3 shows a spinning apparatus for producing fibers from a tractable ceramic precursor.

Once the spinnable ceramic precursors are formed as outlined above, fibers are produced by standard spinning or drawing procedures. An illustrative, but not limiting, spinning apparatus suitable for producing fibers from ceramic precursors is shown in FIG. 3. This simple spinning apparatus can be used to spin fibers of 175 μm, 125 μm, and 75 μm in diameter. The size of the fiber can be changed either by changing the size of the spinneret hole or by a draw-down procedure.

CURING THE CERAMIC PRECURSOR

By "curing" as used herein is meant drying or removal of solvent from the ceramic precursor and setting the ceramic precursor to form an infusible organometallic matrix. In some circumstances, these steps are carried out simultaneously, as for example when drying causes both loss of solvent and intramolecular cross-linking.

Drying

It is preferred that drying be carried out first under carefully controlled conditions so that a dense undistorted product is obtained. Examples of suitable drying conditions include, but are not limited to, simple air drying, drying in a solvent saturated atmosphere, drying at static ambient conditions, drying under dynamic ambient conditions, drying at multiple specific temperatures and drying at ramped temperatures. Choice of the particular drying condition depends upon the size and shape of the particular ceramic material to be produced.

Setting

Once the ceramic precursor has been appropriately dried, it is set or cured in order to form an infusible organometallic matrix. By "infusible" as used herein is meant fixed in a substantially immutable form so that when the organometallic matrix is heated to high temperature in, for example, a sintering or pyrolyzing step the organometallic matrix will not flow, melt, or volatilize. Examples of suitable setting conditions include but are not limited to: oxidative cross-linking in an aerobic environment with, for example, O$_2$, O$_3$, H$_2$O$_2$, peracids or a plasma such as oxygen plasma; irradiation with, for example, γ-rays; or heating in air or oxygen to from about 0° C. to about 200° C.

Figure 2A:
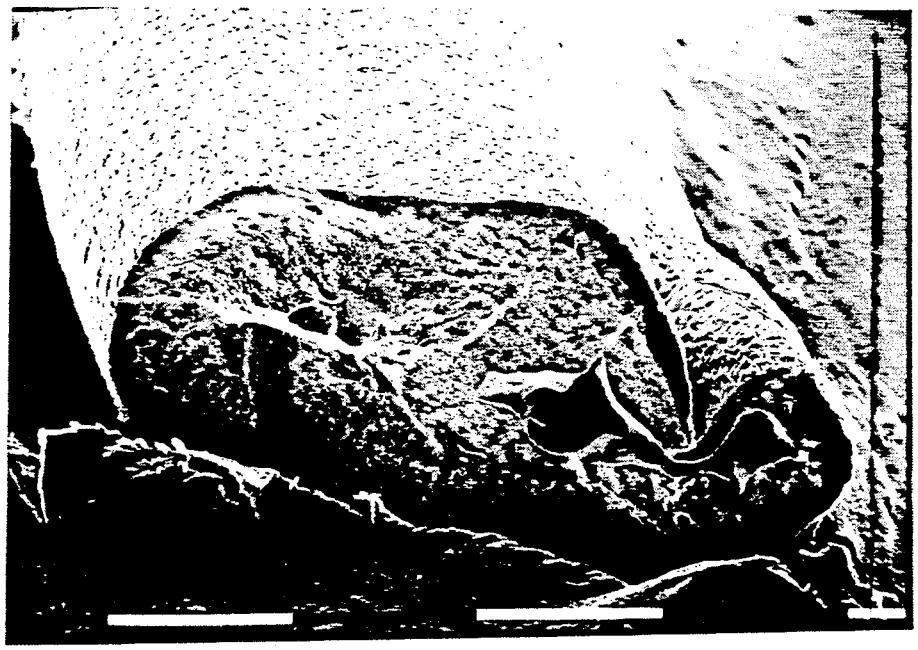
FIGS. 2A and 2B are SEM micrographs showing the shape and structure of fibers produced from a tractable ceramic precursor.

An example of a cured Y—Ba—Cu fiber produced according to Example VIII below can be seen in FIG. 2a.

PYROLYZING THE ORGANOMETALLIC MATRIX

Once the ceramic precursor has been cured, the infusible organometallic matrix is pyrolyzed. By "pyrolyzing" as used herein is meant heating to a temperature of from about 800° C. to about 1100° C. for a period of time sufficient to produce a ceramic material. In certain situations, the carboxylate ligands can serve as the sole source of oxygen for the ceramic material. In these cases, pyrolysis can be carried out in an inert atmosphere such as Ar or N$_2$. Preferably, however, pyrolysis is conducted in an oxidizing atmosphere (air, O$_2$, O$_3$) to insure there are no oxygen vacancies in the ceramic material.

Figure 2B:

An example of a cured and pyrolyzed Y—Ba—Cu fiber produced according to Example VIII below can be seen in FIG. 2b.

TRACTABLE CERAMIC PRECURSOR COMPOSITION

The invention further consists of a tractable ceramic precursor useful for preparing high-temperature superconducting ceramics, the high-temperature superconducting ceramic being represented by empirical Formula I, $$M^1_m M^2_n O_o \qquad (I).$$

In Formula I, $M^1$ is at least one metal element different from $M^2$; $M^2$ represents Cu, Nb, or Ag; and m, n, and o are independent stoichiometric indices of each element in empirical Formula I, provided that when $M^1$ represents more than one metal element, m represents the independent stoichiometric index of each metal element $M^1$. The tractable ceramic precursor consists of an organometallic substance and optionally an inert solvent. The organometallic substance comprises a mixture of one or more compounds independently selected from compounds represented by Formulae X and XI:

 (X),

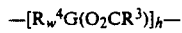 (XI), where G is one or more monovalent, divalent, or trivalent metal elements $M^1$ and $M^2$. $R^3$ is C$_1$–C$_7$ branched or unbranched alkanoate or C$_3$–C$_7$ branched or unbranched alkenoate. $R^4$ is $R^3$ or C$_4$–C$_7$ β-diketone, C$_4$–C$_8$ β-ketoester, or C$_4$–C$_7$ alkoxide. w is zero when G is monovalent, zero or one when G is divalent, and one or two when G is trivalent, and h ranges from 2 to about 200. $R^1$ is hydrogen, alkyl, alkenyl, or alkynyl having 1 to 7 carbons, cycloalkyl or cycloalkenyl having 3 to 7 carbons, cycloalkylalkyl having 4 to 8 carbons, aryl having 5 to 8 carbons, and alkylaryl or arylalkyl having 6 to 8 carbons. These radicals may optionally be substituted with one or more substituents selected from the group consisting of halogen, —OH, —OR, —O$_2$CR, —CO$_2$H, —CO$_2$R, —CO$_3$H, —CO$_3$R, —CONH$_2$, —CONR, —CONHR, —NNH$_2$, —NR$_2$, —NHR, —SR, —SOR, —SO$_2$R, —SO$_2$NR$_2$, —SO$_2$NH$_2$, SO$_2$NHR, or may contain as linking groups —O—, —O—O—, —NH—, —NR—, —CO—, —CO$_2$—, —CONH—, —CONR—, —S—, —SO—, —SO$_2$—, —CO$_2$NH—, and —SO$_2$NR—. R above is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 6 to 7 carbons, and alkylaryl having 7 to 8 carbons. The relative proportions of metal elements M$^1$ and M$^2$ in the mixture being present in substantially the same ratio as the stoichiometric index of metal elements M$^1$ and M$^2$ in empirical Formula I. The compounds represented by Formulae X and XI are made by the procedures previously described.

Optionally, as previously described, metallic particles containing metal elements M$^1$ and M$^2$ can be added to the mixture so that the organometallic substance contains metal elements M$^1$ and M$^2$ in substantially the same ratio as the stoichiometric index of metal elements M$^1$ and M$^2$ in empirical Formula I. In a preferred tractable ceramic precursor, the organometallic substance consists essentially of a mixture of two or more compounds independently selected from compounds represented by Formulae X and XI. Illustrative examples of these compounds are the products of equations 1–8 and the compounds indicated in equations 12, 13, and 15–29 above. Also, as previously described, the tractable ceramic precursor may contain organic polymers to improve the rheology.

In most preferred tractable ceramic precursors, the organometallic substance comprises two or more compounds independently selected from those represented by Formula X. These include compounds wherein R$^1$ or Formula X is hydrogen, C$_1$–C$_7$ branched or straight-chain alkyl, C$_3$–C$_7$ branched or straight-chain alkenyl, C$_4$–C$_7$ β-diketones, C$_4$–C$_8$ β-ketoesters, and C$_1$–C$_8$ branched or unbranched alkoxides. Illustrative examples of these compounds are shown in equations 12, 13, and 15–28 above. Preferred inert solvents that may optionally be added to the organometallic substance to produce a tractable ceramic precursor include THF, NMP, CHCl$_3$, EtOH, xylene, and glycerol.

Without further description, it is believed that one of ordinary skill in the art can, using the preceding description and illustrative examples, make and utilize the present invention to the fullest extent. The following working examples therefore specifically point out preferred embodiments of the present invention, and are not to be construed as limiting in any way of the remainder of the disclosure. In the examples that follow, the following standard abbreviations are used: Hex=hexane; Et$_2$O=diethyl ether, THF=tetrahydrofuran; Me=methyl; Et=ethyl; AcAc=2,4-pentanedione; SEM=scanning electron microscope.

EXAMPLE I

Barium Carboxylate Synthesis (1) Twenty grams of technical grade BaO was weighed into a round bottom flask equipped with a reflux condenser. Thirty mL of propionic acid and five mL of acetic anhydride were added to the flask and the mixture was refluxed overnight. The resulting gray gel was dissolved in THF and filtered through a celite covered glass frit. The filtrate was treated with activated charcoal, warmed, and filtered once again. The product was precipitated with acetonitrile and Ba(O$_2$CCH$_2$CH$_3$)$_2$ was collected as a white solid and dried in vacuo.

(2) Thirteen grams of Ba metal was cut up into small pieces inside a dry box and placed in a 200 mL Sohenk flask. Sixty mL THF was added, followed by slow addition of 2.5 equivalents (95.5 mL) ethylhexanoic acid. The mixture evolved H$_2$ gas concomitant with the formation of a white product. After all the Ba metal had reacted, the white solid, Ba(O$_2$CCHEt(CH$_2$)$_3$CH$_3$)$_2$, was collected on a filter frit and washed with CH$_3$CN. Recrystallization from THF/CH$_3$CN provided a pure white product.

(3) Following the procedure of Example I(2), barium carboxylates of the general Formula Ba(O$_2$CR)$_2$ were synthesized where R=CH$_3$, CH$_2$CH$_3$, CHMe$_2$, CHEt(CH$_2$)$_3$CH$_3$, CF$_2$CF$_3$, CF$_2$CF$_2$CF$_3$, by substituting the appropriate acid for ethylhexanoic except that: when R=CHMe$_2$, isobutyric anhydride was added to the mixture to dry it; when R=CHEt(CH$_2$)$_3$CH$_3$, the product isolated was a white-tan oily solid; when R=CF$_2$CF$_2$CF$_3$, the product was soluble in Hex, Et$_2$O, THF, and CH$_3$CN and was isolated by cooling to −30° C. and collecting the precipitate.

EXAMPLE II

Copper (II) Carboxylate Synthesis

Copper carboxylates, Cu(O$_2$CR)$_2$ where R=H, CH$_2$CH$_3$, CHMe$_2$ were prepared by the procedure of Example I by substituting CuO for BaO in the refluxing mixture. Recrystallization resulted in the formation of aqua blue solids. When R=CHMe$_2$, the product was recrystallized from THF/hexane and isolated as an aqua blue powder.

EXAMPLE III

Copper (I) Carboxylate Synthesis

A portion of Cu(O$_2$CCH$_3$)$_2$·H$_2$O was dried by refluxing in a toluene solution containing acetic anhydride. Copper foil was added to the mixture and after a period of four days, a white solid was formed. The solid was isolated, recrystallized, and dried in vacuo.

EXAMPLE IV

Yttrium Carboxylate Synthesis (1) Y(O$_2$CCH$_2$CH$_3$)$_3$ was synthesized by the addition of Y$_2$O$_3$ to a refluxing propionic acid/propionic anhydride mixture following the procedure of Example I.

Following the same procedure, Y(O$_2$CCH$_3$)$_3$ was produced from an acetic acid/acetic anhydride except that Y(O$_2$CCH$_3$)$_3$ was insoluble in Hex, Et$_2$O, THF, EtOH and MeOH and therefore was purified by simply washing with Et$_2$O and dried in vacuo.

(2) Yttrium carboxylates of general formula Y(O$_2$CR)$_3$ were synthesized, where R=CH$_3$, CH$_2$CH$_3$, CHMe$_2$, CHEt(CH$_2$)$_3$CH$_3$, CF$_2$CF$_3$, CF$_2$CF$_2$CF$_3$, by the procedure described in Example I(2) by substituting Y metal for Ba, and adding the appropriate acid to the THF dispersed Y. The Y—THF-acid mixture was refluxed for one to three days with the optional addition of HgCl$_2$ catalyst producing yttrium carboxylate as a white precipitate.

(3) Y(O$_2$CHMe$_2$)$_3$ was produced by weighing a 1.5 g portion of Y(C$_5$H$_7$O$_2$)$_3$ into a flask. Seven mL of isobutyric acid and one mL of isobutyric anhydride were added and the mixture was refluxed overnight. After this time, 20 mL hexane was added to give a white precipitate and an orange-yellow liquid. The liquid was decanted and the creamy white product was washed with hexane and dried in vacuo.

EXAMPLE V

Preparation of Stoichiometric Y—Ba—Cu Ceramic Precursors (1) Two equivalents (0.90 g) Ba(O$_2$CCHEt(CH$_2$)$_3$CH$_3$)$_2$ was dissolved in a minimum of THF. One equivalent (0.60 g) Y(AcAc)$_3$ was added to this to make a homogeneous mixture. In a separate flask, three equivalents of Cu(O$_2$CCHMe$_2$)$_2$ was dissolved in THF and added to the Ba—Y mixture. Partial removal of THF via evaporation resulted in an aqua blue mixture.

(2) Three equivalents (0.41 g) of Cu(O$_2$CCHMe$_2$)$_2$, one equivalent (0.18 g) of Ba(O$_2$CCHMe$_2$)$_2$, one equivalent (0.23 g) of Ba(O$_2$CCHEt(CH$_2$)$_3$CH$_3$)$_2$, and one equivalent (0.20 g) Y(O$_2$CCHMe$_2$)$_3$ were combined in a flask. THF was added until a translucent, homogeneous, aqua blue mixture was achieved.

(3) Three equivalents of Cu(O$_2$CCF$_3$)$_2$, one equivalent of Ba(O$_2$CCF$_3$)$_2$, one equivalent of Ba(O$_2$CCHEt(CH$_2$)$_3$CH$_3$)$_2$, and one equivalent of Y(O$_2$CCF$_3$)$_2$ were combined with a minimum of THF to make a smooth, viscous, sky blue mixture.

(4) Two equivalents (0.67 g) of Bi(O$_2$CCHMe$_2$)$_3$, one equivalent (0.19 g) of Sr(O$_2$CCHMe$_2$)$_2$, one equivalent (0.26 g) of Sr(O$_2$CCHEt(CH$_2$)CH$_3$)$_2$, one equivalent (0.15 g) of Ca(O$_2$CCHMe$_2$)$_2$, and two equivalents (0.34 g) of Cu(O$_2$CCHMe$_2$)$_2$ were combined in a flask. The dry powders were thoroughly mixed, after which THF was added to yield a translucent, homogeneous, viscous blend.

EXAMPLE VI

Preparation of Nonstoichiometric Y—Ba—Cu Ceramic Precursors (1) In separate flasks, nonstoichiometric binary mixtures of Ba(O$_2$CCHEt(CH$_2$)$_3$CH$_3$)$_2$+Cu(O$_2$CCHMe$_2$)$_2$ and Ba(O$_2$CCHEt(CH$_2$)CH$_3$)$_2$+Y(AcAc)$_3$ were prepared. A portion of these two mixtures were combined resulting in the immediate formation of a new periwinkle blue viscous mixture.

(2) Ba(O$_2$CCHEt(CH$_2$)$_3$CH$_3$)$_2$ was added to Y(AcAc)$_3$ and Cu(O$_2$CCHMe$_2$)$_2$ to form a nonstoichiometric periwinkle blue viscous mixture.

EXAMPLE VII

Preparation of a Superconducting Ceramic Fiber From a Nonstoichiometric Y—Ba—Cu Ceramic Precursor Fibers up to 4 meters in length were drawn from the periwinkle blue viscous mixture prepared according to Example VI (2). These ceramic fibers were periwinkle blue, porous and appeared dual phase. Pyrolysis of a sample fiber resulted in an intact ceramic fiber displaying some superconducting properties.

EXAMPLE VIII

Preparation of a Superconducting Ceramic Fiber From a Stoichiometric Y—Ba—Cu Ceramic Precursor Ceramic fibers were drawn from the blue viscous mixtures prepared according to Example V(1). Fibers up to 50 cm were drawn from the mixture and air-dried. When these ceramic fibers were examined in the SEM, they were found to be fairly smooth and absent any gross defects (see FIG. 2a). Pyrolysis at 900° C. produced ceramic fibers of reduced volume which displayed the Meissner effect. Examination of the ceramic fibers after pyrolysis in the SEM showed them to be scaly and filled with micro-cracks (see FIG. 2b).

While the invention has been described in conjunction with preferred embodiments, one of ordinary skill, after reading the foregoing specification, will be able to effect various changes, substitutions of equivalents, and alterations to the subject matter set forth herein, without departing from the spirit and scope thereof. Hence, the invention can be practiced in ways other than those specifically described herein. It is therefore intended that the protection granted by Letters Patent hereon be limited only by the appended claims and equivalents thereof.

The embodiments of the invention in which an exclusive property or privilege is claimed are defined as follows:

1. A method for producing a high-temperature superconducting ceramic fiber represented by empirical Formula I:

$$M_m^1 M_n^2 O_o \qquad (I)$$

wherein:
M$^1$ is at least one metal element different from M$^2$,
M$^2$ is Cu or Nb, and
m, n, and o are independent stoichiometric indices for each element in empirical Formula I, provided that when M$^1$ is more than one metal element, m is an independent stoichiometric index for each metal element M$^1$, the process comprising the steps of:
(a) forming a tractable ceramic precursor, the precursor comprising an organometallic substance containing metal elements M$^1$ and M$^2$, the relative proportions of metal elements M$^1$ and M$^2$ in the organometallic substance being in substantially the same ratio as the stoichiometric index of metal elements M$^1$ and M$^2$ in Formula I,
(b) shaping the ceramic precursor into a self-supporting fiber,
(c) curing the tractable ceramic precursor, thereby forming an infusible organometallic matrix, and
(d) pyrolyzing the infusible organometallic matrix at a temperature sufficient to form the high-temperature superconducting fiber.

2. The method of claim 1, wherein the shaping step comprises drawing or spinning the ceramic precursor into a fiber.

3. The method of claim 1, wherein the organometallic substance comprises an organometallic complex comprising a mixture of compositions selected from the group consisting of organometallic clusters, organometallic polymers, and combinations thereof.

4. The method of claim 3 wherein the organometallic clusters are represented by Formula VI, $$G(R^0) \quad (VI),$$

where:
G is one or more metal elements selected from $M^1$ and $M^2$; and
$R^0$ is independently one or more lower organic ligands selected from the group consisting of alkyl, alkenyl or alkynyl having 1 to 8 carbons, cycloalkyl or cycloalkenyl having 3 to 8 carbons, cycloalkylalkyl having 4 to 8 carbons, aryl having 5 to 8 carbons, alkylaryl or arylalkyl having 6 to 8 carbons, and carboxy or peroxycarboxy having 1 to 8 carbons, which radicals may optionally be substituted with one or more substituents selected from the group consisting of halogen, —OH, —OR, —O$_2$CR, —CO$_2$H, —CO$_2$R, —CO$_3$H, —CO$_3$R, —CONH$_2$, —CONR$_2$, —CONHR, —NNH$_2$, —NR$_2$, —NHR, —SR, —SOR, —SO$_2$R, —SO$_2$NR$_2$, —SO$_2$NH$_2$, —SO$_2$NHR, or may contain as linking groups —O—, —O—O—, —NH—, —NR—, —CO—, —CO$_2$—, —CONH—, —CONR—, —S—, —SO—, —SO$_2$—, —CO$_2$NH—, and —SO$_2$NR—, R is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 6 to 7 carbons, and alkylaryl having 7 to 8 carbons.

5. The method of claim 4 wherein $R^0$ is represented by Formula VII, $$O_2CR^1 \quad (VII),$$

where $R^1$ is hydrogen, alkyl, alkenyl or alkynyl having 1 to 7 carbons, cycloalkyl or cycloalkenyl having 3 to 7 carbons, cycloalkylalkyl having 4 to 7 carbons, aryl having 5 to 7 carbons and alkylaryl or arylalkyl having 6 to 8 carbons, which radicals may optionally be substituted with one or more substituents selected from the group consisting of halogen, —OH, —OR, —O$_2$CR, —CO$_2$H, —CO$_2$R, —CO$_3$H, —CO$_3$R, —CONH$_2$, —CONR, —CONHR, —NNH$_2$, —NR$_2$, —NHR, —SR, —SOR, —SO$_2$R, —SO$_2$NR$_2$, —SO$_2$NH$_2$, —SO$_2$NHR, or may contain as linking groups —O—, —O—O—, —NH—, —NR—, —CO—, —CO$_2$—, —CONH—, —CONR—, —S—, —SO—, —SO$_2$—, —CO$_2$NH—, and —SO$_2$NR—, R is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 6 to 7 carbons, and alkylaryl having 7 to 8 carbons.

6. The method of claim 4 wherein $R^0$ is selected from the group consisting of $C_5$-$C_7$ β-diketones, $C_5$-$C_8$ β-ketoesters, $C_1$-$C_8$ linear or branched alkanoic acids, $C_2$-$C_8$ branched or linear alkenoic acids, $C_1$-$C_8$ linear or branched alcohols, $C_2$-$C_6$ saturated or unsaturated dicarboxylic acids, $C_2$-$C_6$ oxygen-substituted dicarboxylic acids, and $C_4$-$C_6$ tricarboxylic acid.

7. The method of claim 3 wherein the organometallic polymers comprise polymers where the repeat unit moiety is represented by Formula VIII, $$-[G-R^2]_g- \quad (VIII),$$

where G is one or metal elements selected from $M^1$ and $M^2$, $R^2$ is at least one lower organic ligand for each metal element $M^1$ and $M^2$, each lower organic ligand $R^2$ is independently selected from the group consisting of: alkyl, alkenyl, or alkynyl having 1 to 8 carbons, cycloalkyl or cycloalkenyl having 3 to 8 carbons, cycloalkylalkyl having 4 to 8 carbons, aryl having 5 to 8 carbons, alkylaryl or arylalkyl having 6 to 8 carbons, and carboxy or peroxycarboxy having 1 to 8 atoms, which radicals may optionally be substituted with one or more substituents selected from the group consisting of halogen, —OH, —OR, —O$_2$CR, —CO$_2$H, —CO$_2$R, —CO$_3$H, —CO$_3$R, —CONH$_2$, —CONR$_2$, —CONHR, —NNH$_2$, —NR$_2$, —NHR, —SR, —SOR, —SO$_2$R, —SO$_2$NR$_2$, —SO$_2$NH$_2$, SO$_2$NHR, or may contain as linking groups —O—, —O—O—, —NH—, —NR—, —CO—, —CO$_2$—, —CONH—, —CONR—, —S—, —SO—, —SO$_2$—, —CO$_2$NH—, and —SO$_2$NR—, R is selected from the group of alkyl having 1 to 4 carbons, alkenyl having 2 to 4 carbons, cycloalkyl or cycloalkenyl having 3 to 4 carbons, cycloalkylalkyl having 4 to 6 carbons, aryl having 6 to 7 carbons, and alkylaryl having 7 to 8 carbons; and g ranges from about 2 to 200.

8. The method of claim 7 wherein $R^2$ is $$(O_2CR^3)(R^4)_w \quad (IX),$$

where
$R^3$ is $C_1$-$C_7$ alkanoate, or $C_1$-$C_7$ alkenoate;
$R^4$ is $R^3$ or $C_4$-$C_7$ β-diketone, $C_4$-$C_8$ β-ketoester; $C_4$-$C_7$ alkoxide; and
w is zero or one when G is divalent, and one or two when G is trivalent.

9. A method for producing a high-temperature superconducting ceramic fiber represented by empirical Formula I:

$$M^1_m M^2_n O_o \quad (I)$$

wherein:
$M^1$ is $L_j A_k$,
wherein:
L is at least one lanthanide, actinide, Y, Tl, or Bi;
A is at least one alkaline earth element;
j ranges from about 1 to about 2;
k ranges from about 2 to about 3;
$M^2$ is Cu or Nb;
n is about 2, 3, 4, or 5; and
o ranges from about 6 to about 10,
the process comprising the steps of:
(a) forming a tractable ceramic precursor, the precursor comprising an organometallic substance containing metal elements $M^1$ and $M^2$, the relative proportions of metal elements $M^1$ and $M^2$ in the organometallic substance being in substantially the same ratio as the stoichiometric index of metal elements $M^1$ and $M^2$ in Formula I,
(b) shaping the ceramic precursor into a self-supporting fiber,
(c) curing the tractable ceramic precursor, thereby forming an infusible organometallic matrix and,
(d) pyrolyzing the infusible organometallic matrix at a temperature sufficient to form the high-temperature superconducting ceramic fiber.

10. The method according to claims 1 or 9, wherein said ceramic precursor is substantially anhydrous.

11. The method of claim 9, wherein the shaping step comprises drawing or spinning the ceramic precursor into a fiber.

12. The method of claim 1 wherein the step of curing comprises cross-linking the precursor.

13. The method of claim 9 wherein the step of curing comprises the step of heating the ceramic precursor to a temperature sufficient to cause cross-linking of the ceramic precursor.

14. The method of claim 9 wherein the step of pyrolyzing is carried out in an aerobic environment.

15. The method of claim 9 wherein the high-temperature superconducting ceramic represented by Formula I is selected from the group consisting of compounds represented by empirical Formulae II, III, IV, and V:

$$LBa_2Cu_3O_{\sim 6.8} \quad \text{(II)},$$

$$Tl_2Ba_2Cu_3O_{\sim 8} \quad \text{(III)},$$

$$Bi_2Sr_{3-z}Ca_zCu_2O_{\sim 8} \quad \text{(IV)},$$

$$La_2SrNb_5O_{10} \quad \text{(V)},$$

where:
L is Y or a lanthanide metal; and
z ranges from about 0.4 to about 0.9.

* * * * *

UNITED STATES PATENT AND TRADEMARK OFFICE
CERTIFICATE OF CORRECTION

Page 1 of 2

PATENT NO. : 5,071,833
DATED : December 10, 1991
INVENTOR(S) : R.M. Laine et al.

It is certified that error appears in the above-identified patent and that said Letters Patent is hereby corrected as shown below:

| COLUMN | LINE | |
|---|---|---|
| 2 | 37 | "than" should be --that-- |
| 3 | 33 | delete "or alkenyl" |
| 4 | 29 | "than" should be --that-- |
| 7 | 26 | after "$C_1$-$C_8$" insert --alkoxide, $C_4$-$C_8$-- |
| 9 | 61 | "mono" should be --mono- -- |
| 11 | 43 | "$CHCO_2]n]$" should be --$CHCO_2]$-$_n$-- |
| 11 | 50 | "$n(RCO)_2)_2$" should be --$n(RCO_2)_2$-- |
| 12 | 15 | "approximate" should be --appropriate-- |
| 14 | 37 | "$m^2$ i" should be --$m^2$ in-- |
| 14 | 41 | "combines" should be --combined-- |
| 19 | 39 | "$R^1$ or" should be --$R^1$ of-- |
| 22 (Claim 1, line 15) | 46 | "comprising" should be --consisting essentially of-- |
| 22 (Claim 1, line 27) | 58 | after "superconducting" insert --ceramic-- |
| 24 (Claim 9, line 17) | 49 | "comprising" should read --consisting essentially of-- |

UNITED STATES PATENT AND TRADEMARK OFFICE
CERTIFICATE OF CORRECTION

PATENT NO. : 5,071,833
DATED : December 10, 1991
INVENTOR(S) : R.M. Laine et al.

It is certified that error appears in the above-identified patent and that said Letters Patent is hereby corrected as shown below:

| COLUMN | LINE | |
|---|---|---|
| 25 (Claim 14, line 1) | 6 | "aerobic" should be --oxidizing-- |
| Title page, Item [75] Inventors | | "both" should be --Ilhan A. Aksay, Bellevue; Corrie B. Martin, Seattle; and John J. Lannutti, Seattle, all-- |

Signed and Sealed this

Fifteenth Day of June, 1993

Attest:

MICHAEL K. KIRK

Attesting Officer

Acting Commissioner of Patents and Trademarks